US010629586B2

(12) United States Patent
Paul et al.

(10) Patent No.: US 10,629,586 B2
(45) Date of Patent: Apr. 21, 2020

(54) DUAL FIN SILICON CONTROLLED RECTIFIER (SCR) ELECTROSTATIC DISCHARGE (ESD) PROTECTION DEVICE

(71) Applicant: INDIAN INSTITUTE OF SCIENCE, Bangalore, Karnataka (IN)

(72) Inventors: Milova Paul, Bangalore (IN); Mayank Shrivastava, Bangalore (IN); B. Sampath Kumar, Bangalore (IN); Christian Russ, Diedorf (DE); Harald Gossner, Riemerling (DE)

(73) Assignee: INDIAN INSTITUTE OF SCIENCE, Bangalore (IN)

( * ) Notice: Subject to any disclaimer, the term of this patent is extended or adjusted under 35 U.S.C. 154(b) by 0 days.

(21) Appl. No.: 15/883,306

(22) Filed: Jan. 30, 2018

(65) Prior Publication Data

US 2019/0013310 A1 Jan. 10, 2019

(30) Foreign Application Priority Data

Feb. 1, 2017 (IN) .............................. 201741003771

(51) Int. Cl.
*H01L 27/02* (2006.01)
*H01L 29/74* (2006.01)
*H01L 29/20* (2006.01)
*H01L 29/06* (2006.01)
*H01L 29/78* (2006.01)

(52) U.S. Cl.
CPC ...... *H01L 27/0262* (2013.01); *H01L 29/0669* (2013.01); *H01L 29/2003* (2013.01); *H01L 29/7436* (2013.01); *H01L 29/7851* (2013.01)

(58) Field of Classification Search
CPC . H01L 29/785–7856; H01L 2029/7857–7858; H01L 29/7851; H01L 27/0262
See application file for complete search history.

(56) References Cited

U.S. PATENT DOCUMENTS

| 6,909,149 | B2 | 6/2005 | Russ et al. |
| 7,135,745 | B1 | 11/2006 | Horch et al. |
| 7,638,370 | B2 | 12/2009 | Gossner et al. |
| 7,943,438 | B2 | 5/2011 | Gauthier, Jr. et al. |
| 8,455,947 | B2 | 6/2013 | Shrivastava et al. |

(Continued)

*Primary Examiner* — Stephen M Bradley
(74) *Attorney, Agent, or Firm* — Oliff PLC

(57) ABSTRACT

The present disclosure relates to a Dual Fin SCR device having two parallel fins on which cathode, anode, n- and p-type triggering taps are selectively doped, wherein one Fin (or group of parallel Fins) comprises anode and n-tap, and other Fin (or group of parallel Fins) comprises cathode and p-tap. As key regions of the proposed SCR (anode and cathode), which carry majority of current after triggering, are placed diagonally, they provide substantial benefit in terms of spreading current and dissipating heat. The proposed SCR ESD protection device helps obtain regenerative feedback between base-collector junctions of two back-to-back bipolar transistors, which enables the proposed SCR to shunt ESD current. The proposed SCR design enables lower trigger and holding voltage for efficient and robust ESD protection. The proposed SCR device/design helps offer a tunable trigger voltage and a holding voltage with highfailure threshold.

18 Claims, 15 Drawing Sheets

(56) References Cited

U.S. PATENT DOCUMENTS

| | | | |
|---|---|---|---|
| 8,455,949 B2 * | 6/2013 | Gossner | H01L 27/0262 |
| | | | 257/355 |
| 8,963,201 B2 | 2/2015 | Shrivastava et al. | |
| 9,236,374 B2 | 1/2016 | Campi, Jr. et al. | |
| 9,240,471 B2 | 1/2016 | Di Sarro et al. | |
| 2004/0207021 A1 | 10/2004 | Russ et al. | |
| 2005/0212051 A1 | 9/2005 | Jozwiak et al. | |
| 2014/0097465 A1 | 4/2014 | Shrivastava et al. | |
| 2016/0056147 A1 * | 2/2016 | Li | H01L 27/0262 |
| | | | 257/173 |
| 2017/0278839 A1 * | 9/2017 | Lai | H01L 27/0262 |

* cited by examiner

DUAL FIN SILICON CONTROLLED RECTIFIER (SCR) ELECTROSTATIC DISCHARGE (ESD) PROTECTION DEVICE

TECHNICAL FIELD

The present disclosure relates to the field of ESD protection devices. In particular, the present disclosure pertains to a dual fin SCR ESD protection devices.

BACKGROUND

Background description includes information that may be useful in understanding the present invention. It is not an admission that any of the information provided herein is prior art or relevant to the presently claimed invention, or that any publication specifically or implicitly referenced is prior art.

With planar bulk Metal-Oxide Semiconductor (MOS) devices reaching their scaling limits, FinFETs, Trigate, and similar non-planar technologies have become popular in recent days for use in technologies for sub-14 nm gate lengths. These technologies are found to be promising for System on Chip (SoC) applications that need reduced system cost, size, and power while enjoying improved system performance. A SoC chip in advanced CMOS consists of various analog, RF, and digital functional blocks, each of which requires dedicated ESD protection. SCRs, for example, are a must for Electrostatic Discharge (ESD) protection in low voltage-high speed I/O as well as for ESD protection of RF pads due to least parasitic loading and smallest foot print offered by SCRs. Existing SCRs suffer from very high turn-on and holding voltage, which issue becomes even severe in non-planar technologies and cannot be handled by conventional approaches such as diode- or transient-turn-on techniques.

Although the advent of non-planar technologies has paved new and efficient ways to replace their planar counterparts by offering beneficial technological solutions to scale conventional transistors, this has come with a price of lowered ESD robustness in these advanced technology nodes. ESD is a random event that leads to massive flow of current (in amperes) between bodies having different electrostatic potential for sub-500 ns duration. Such high current injection can cause severe device damage by gate oxide breakdown or meltdown of device active area. Therefore, it is important to design effective ESD protection solutions in non-planar technology nodes. In the last 10 years, there have been extensive investigations on designing several protection concepts like Diodes, Bipolar Junction Transistors (BJTs), Metal-oxide-semiconductor field effect transistors (MOSFETs) and SCRs in FinFET (non-planar) technology. However, conventional SCRs (FIG. 1) suffer from very high turn-on and holding voltage, which issue becomes even severe in non-planar technologies and cannot be handled by conventional approaches such as diode- or transient-turn-on techniques. Furthermore, conventional planar SCR design (refer to FIG. 1) cannot be directly deployed to non-planar technologies due to technological limitations. Existing SCRs also have poor bipolar efficiency and demonstrates weak regenerative feedback mechanism.

FIG. 2 shows (a) top view and (b) cross sectional view of an existing SCR device (P-N-P-N) for FinFET or planar Silicon-in-Insulator (SOI) technology, which SCR device does not provide options for tuning its trigger or holding voltage and suffers from high on-resistance.

FIG. 3 shows an existing gated SCR device for planar SOI technology, which is also applicable for emerging technologies like FinFET. However, such a SCR device provides weak controllability over its turn-on voltage, and has no control over holding voltage and suffers from high on-resistance.

There are many other additional prior arts that have different ways of implementing existing SCR-like devices in planar SOI and FinFET technologies with a weak tuning capability of holding and trigger voltage. Such devices do not provide robust tuning capability or low trigger/holding voltage. US Publication US2004/0207021 A1, U.S. Pat. No. 6,909,149 B2, and US Publication US2005/0212051 A 1 disclose an SCR with N and P trigger taps for injecting trigger current (for tuning trigger/holding voltage) in planar SOI technology. U.S. Pat. No. 7,943,438B2 discloses top and cross sectional views of another SCR invention with N and P taps (terminals labeled with N-body and P-body) in a different scheme in order to control holding/trigger voltage in planar SOI technology. U.S. Pat. Nos. 7,638,370B2 and 8,455,947B2 disclose cross sectional views and isometric views of additional SCR inventions in FinFET technology. U.S. Pat. Nos. 9,240,471B2 and 9,236,374B2 disclose additional SCR inventions in FinFET technology. U.S. Pat. No. 7,135,745B1, U.S. Pat. No. 8,963,201B2, and US2014/0097465A1 disclose additional SCR inventions in bulk FinFET technology, of which however have the above-mentioned disadvantages.

FIG. 4 and FIG. 5 shows additional designs based on prior-art technologies and simulated TLP characteristics using 3D TCAD respectively. Conventional FinFET SCRs are structurally made such that anode, cathode, n-tap and p-tap are individually realized inside a well by one or more Fins (as shown FIGS. 4d & 4e) in such a way that all 4 regions are aligned along one common fin direction (FIGS. 4b & 4c). Conventional SCR device designs based on existing technology were simulated using 3D TCAD, wherein the simulation results depict very high holding voltage of 6.5V (FIG. 5). Moreover, existing SCR devices suffer from lower failure thresholds due to very high current crowding and self-heating in the Fin regions, which significantly degrades the BJT action required for SCR to trigger. FIG. 5 shows very high turn-on voltage and absence of snapback, which depicts that prior-art FinFET SCR designs have missing SCR action and therefore cannot be adapted for low voltage ESD protection concepts attributed to fundamental limitations of tunability within the ESD design window.

There is therefore a need in the art for a SCR design for non-planar technologies with tunable trigger and holding voltage for efficient and robust ESD protection. There is further a need for a SCR design device that has better ESD robustness per unit area.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description used in the appended claims.

OBJECTS OF THE INVENTION

An object of the present disclosure is to propose an ESD protection device.

Another object of the present disclosure is to provide a dual fin SCR ESD protection device.

Another object of the present disclosure is to provide a semiconductor/SCR device for non-planar technologies with tunable trigger and holding voltage for efficient and robust ESD protection.

Another object of the present disclosure is to provide a semiconductor/SCR device that has better ESD robustness per unit area.

SUMMARY

The present disclosure relates to the field of ESD protection devices. In particular, the present disclosure pertains to a dual fin SCR ESD protection devices.

In an aspect, the present disclosure relates to a Dual Fin Silicon Controlled Rectifier (SCR) comprising a first fin configured on a substrate and comprising an anode and a n-tap region; and a second fin configured on the substrate and parallel to the first fin, wherein the second fin comprises a cathode and a p-tap region. The first fin has a base region of first conductivity type (N-Well), and wherein the second fin has base region of second conductivity type (P-Well). In an aspect, the anode is of second conductivity type and n-tap region is of first conductivity type, and wherein the cathode is of first conductivity type and the p-tap region is of second conductivity type.

In an aspect, the anode and the cathode can be placed diagonal to each other, wherein the SCR can be configured to obtain regenerative feedback between base collector junctions of two back-to-back bipolar transistors to shunt ESD current. In an aspect, holding voltage of the SCR can be modified by any or a combination of tuning LAC, tuning well doping profile, and tuning emitter junction depth and lengths. In an aspect, the n-tap and the p-tap can be placed on both sides of emitter to enable carrier conduction path to get divided and base-emitter junction to observe a uniform base potential to help mitigate current crowding resulting in reduced self heating and mobility degradation.

In an aspect, the SCR can be configured in a flipped SCR configuration where the anode and the cathode are placed parallel to each other. In another aspect, the SCR can be configured with gate metallization that isolates the n-tap from the anode, and isolates the p-tap from the cathode. In yet another aspect, the SCR can be configured with shallow trench isolation (STI) separation between the first fin and the second fin. In another aspect, the SCR can be configured with shallow trench isolation (STI) separation between the n-tap and the anode of the first fin, and between the p-tap and the cathode of the second fin. In another aspect, the SCR can be configured with a combination of gate metallization and shallow trench isolation (STI) separation between the first fin and the second fin.

The SCR can include a first set of fins as part of the first fin, and a second set of fins as part of the second fin, wherein the number of fins that form part of the first set and the second set are selected based on any or a combination of optimal failure thresholds, and optimal current handling capability.

In an aspect, the SCR can be configured in transient triggered configuration for ESD protection between pad and ground.

In another aspect, any or both of the first fin and the second fin are replaced by Nano-wires, wherein the nanowire or the fins are made of any or a combination of Si, SiGe, Ge, materials belonging to III-V or III-Nitride groups, transition metal dichalcogenides, or a 2-Dimentional semiconductor.

In an aspect, any or both of the anode or the cathode have deeper junctions compared to the n-tap region and the p-tap region.

In an exemplary implementation, the n-tap region can be connected to VDD, the anode is connected to PAD, and the p-tap region and the cathode are connected with ground, and wherein the SCR is triggered transiently by clamp between the VDD and the Ground.

In an aspect, gate between the n-tap or the p-tap and the anode or the cathode is connected to a trigger circuit or a power bus. In another aspect, the SCR further comprises guard-rings. In yet another aspect, the substrate can be any of a semiconductor or an insulator or a stack of the two.

The present disclosure further relates to a semiconductor device comprising a first fin configured on a substrate and comprising an anode and a n-tap region, wherein the first fin has a base region of first conductivity type (N-Well), and wherein the anode is of second conductivity type and n-tap region is of the first conductivity type; and a second fin configured on the substrate and parallel to the first fin, wherein the second fin comprises a cathode and a p-tap region, wherein the second fin has base region of the second conductivity type (P-Well), and wherein the cathode is of the first conductivity type and the p-tap region is of the second conductivity type.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION

Figure 1:
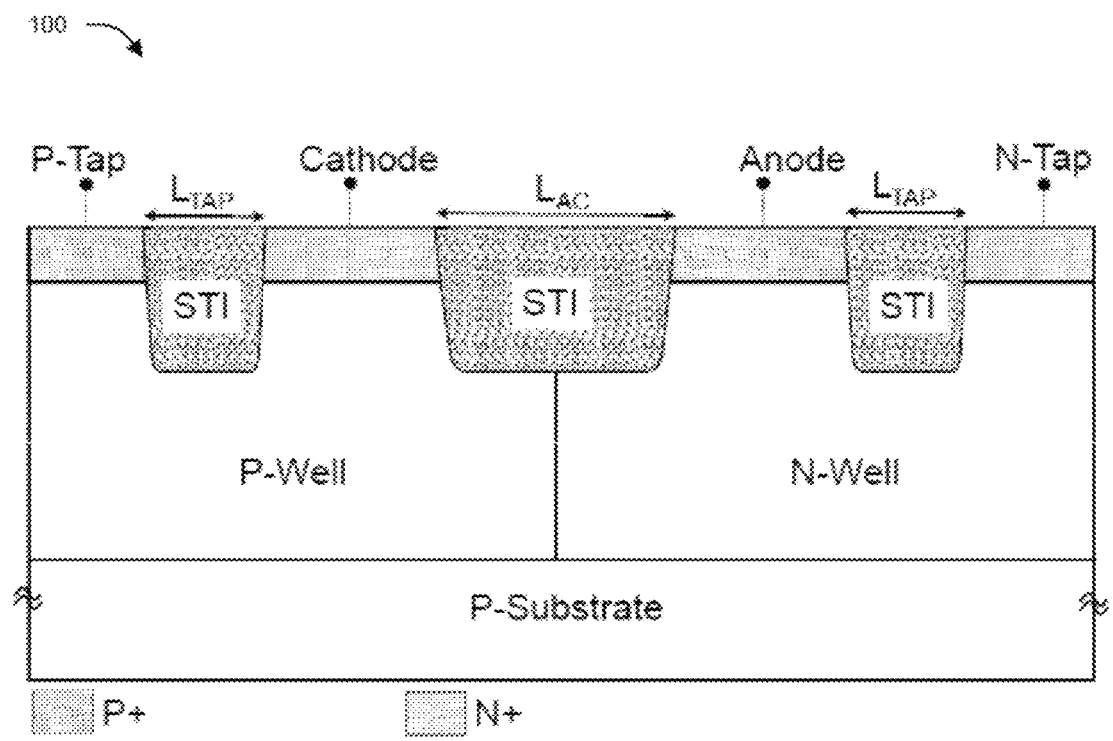
FIG. 1 illustrates a prior art planar SCR design.
Figure 2:
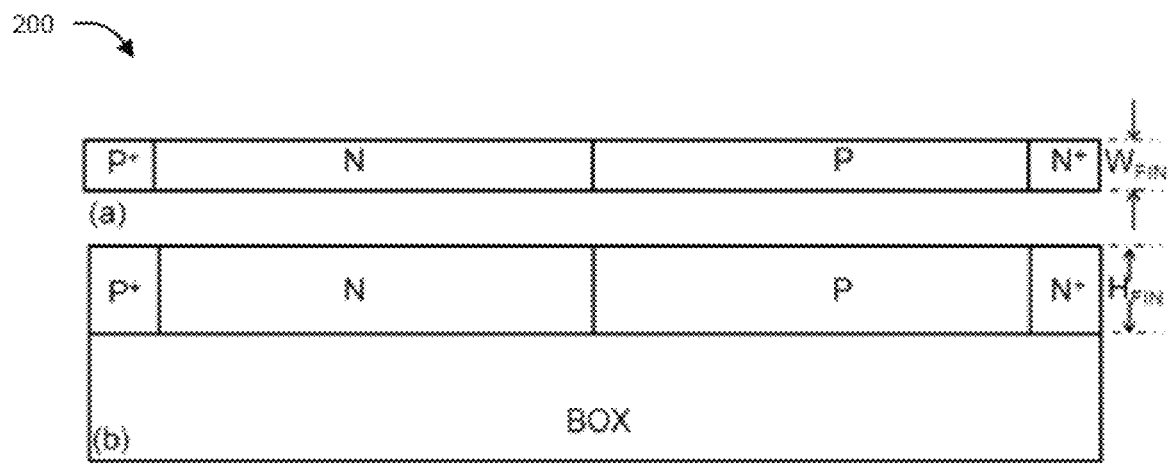
FIG. 2 shows different views of a prior art SCR device (P-N-P-N) for Silicon-in-Insulator (SOI) FinFET technology.
Figure 3:
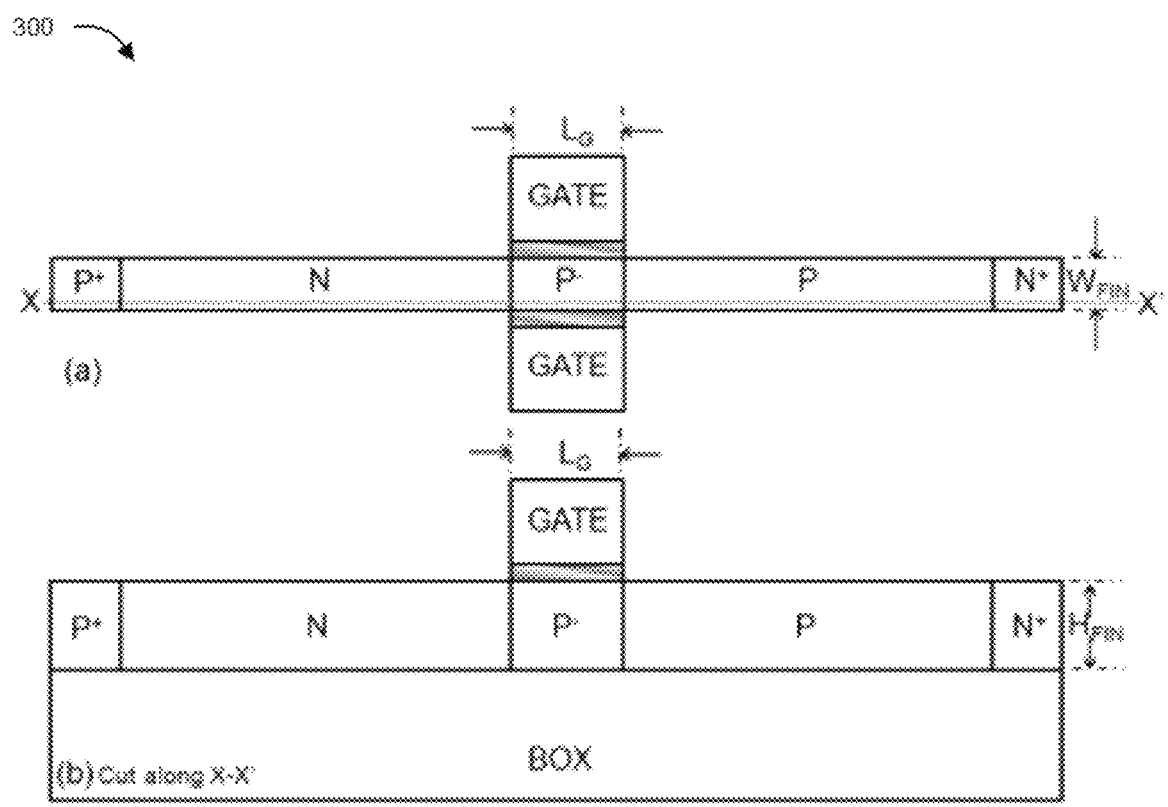
FIG. 3 shows a prior art gated SCR device for SOI FinFET technology.
Figure 4:
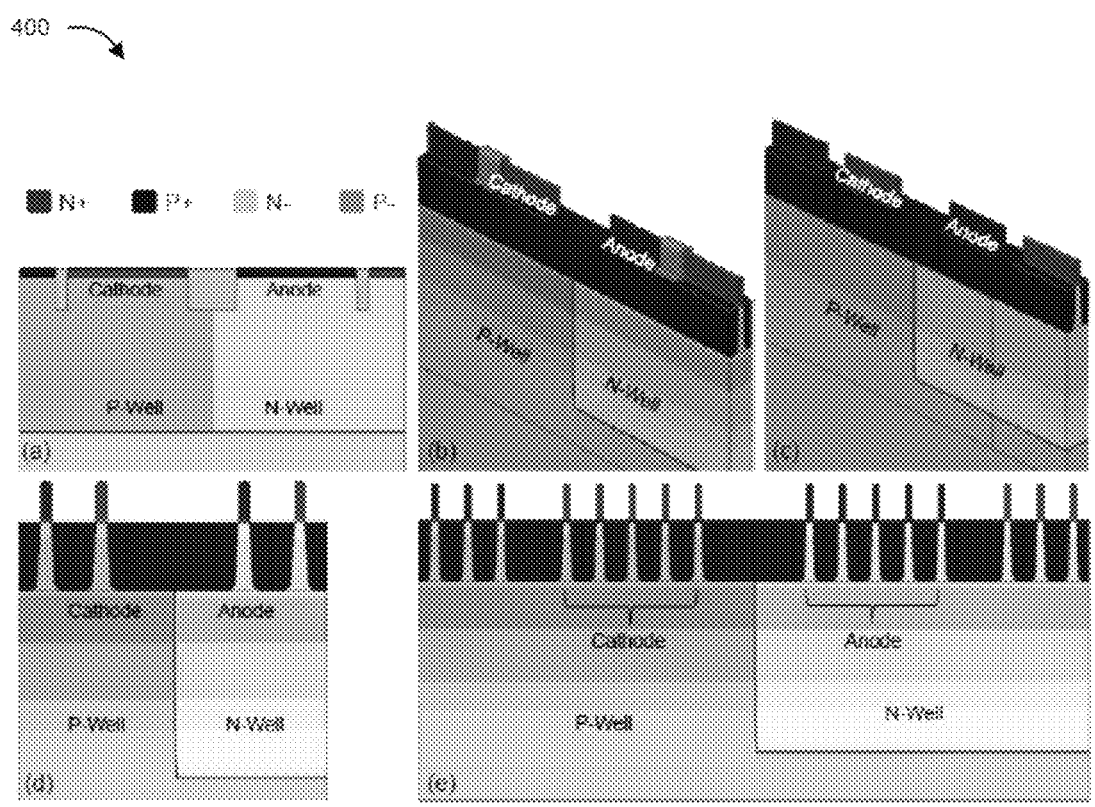
FIGS. 4 and 5 show additional designs based on prior-art technologies and simulated TLP characteristics using 3D TCAD respectively.
Figure 5:
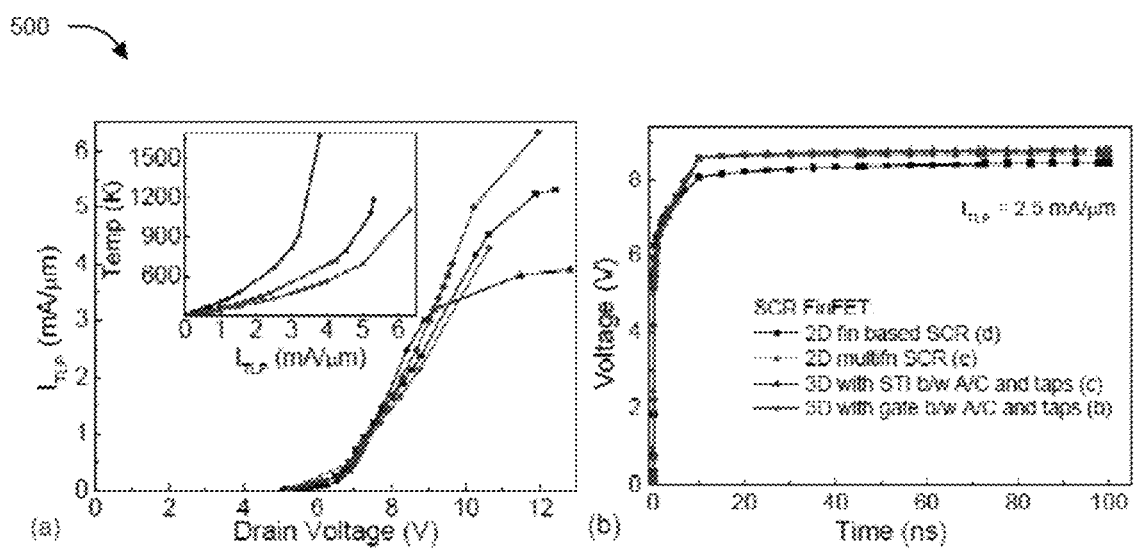

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims.

Various terms as used herein are shown below. To the extent a term used in a claim is not defined below, it should be given the broadest definition persons in the pertinent art have given that term as reflected in printed publications and issued patents at the time of filing.

The present disclosure relates to a novel SCR design for non-planar technologies with lower trigger and holding voltage for efficient and robust ESD protection. In an aspect, the proposed SCR device/design comprises of dual fin arrangement, which helps offer a tunable trigger voltage of <6V and a holding voltage of <2V. In another aspect, the proposed dual fin SCR displays a failure threshold of 20 mA/$\mu$m$^2$, which is at least 2 times reduction in SCR area compared to its planar counter-part. In another aspect, tunability of trigger and holding voltage adds additional flexibility in the design, and therefore allows effective ESD protection solutions in FinFET and beyond FinFET technologies.

In another aspect, the present disclosure further discloses a novel SCR design for non-planar technologies with sub-3V trigger and holding voltage for efficient and robust ESD protection. Besides low trigger and holding voltage, the proposed device offers a 2 times better ESD robustness per unit area. The proposed SCR device for non-planar technologies has tunable trigger and holding voltage for efficient and robust ESD protection. Beside low trigger and holding voltage, the proposed device also offers at least 2 times better ESD robustness per unit area, is compatible with standard process flow and design rules, has lower trigger voltage, holding voltage and on-resistance, and has no added capacitive loading.

As would be appreciated, SCR predominantly functions based on a regenerative mechanism between two opposite polarity bipolar transistors connected in a way that one bipolar triggers the other and vice versa. Therefore, effective triggering mechanism of an SCR is primarily correlated with the intrinsic gain and bipolar efficiency of individual bipolar transistors, which is largely affected by base-emitter junction field profile, majority carrier mobility in the base region, and minority carrier lifetime in the base region. These parameters are severely affected by current crowding and self heating in the base region of the BJT. A conventional single fin SCR does not have the flexibility to adjust the aspect ratio of base junction, due to its invariable fin shape and hence suffers from current crowding and self heating in the base-emitter region, which significantly degrades BJT performance, and hence SCR performance. In an aspect, the proposed SCR design overcomes this limitation by providing an efficient forward current conduction path to trigger the base-emitter junction of BJT. Moreover, the proposed design relaxes/mitigates any current crowding effect, which boosts BJT performance and hence SCR. Beside this, tunability of I-V characteristics is also achieved due to flexibility or independent control of design.

Figure 6:
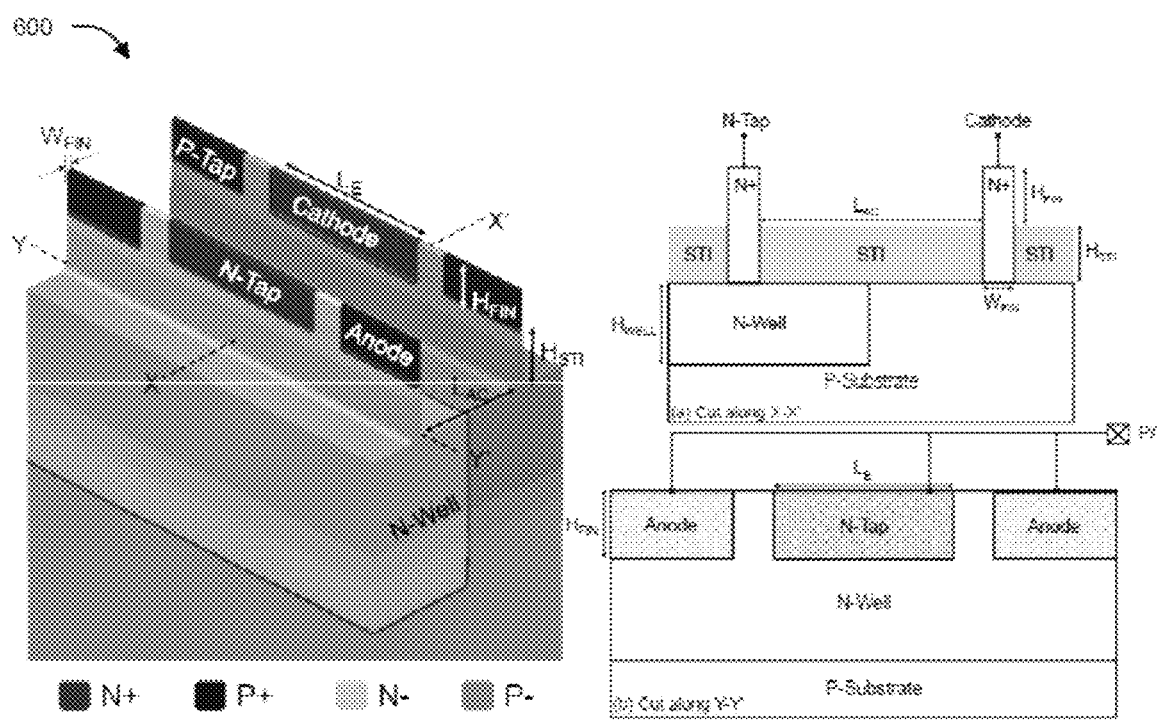
FIG. 6 illustrates an exemplary 3-Dimensional representation or isometric view of the proposed Dual Fin SCR device in accordance with an embodiment of the present disclosure.

FIG. 6 illustrates an exemplary 3-Dimensional representation or isometric view of the proposed Dual Fin SCR device 600 in accordance with an embodiment of the present disclosure, wherein the FIG. 6 further depicts its cross-sectional view along (a) X-X' and (b) Y-Y' cutline. As can be seen, anode and cathode regions are placed diagonal to each other. The proposed dual fin SCR, as shown in FIG. 6, therefore includes two parallel fins, on which, cathode, anode, n- and p-type triggering taps are selectively doped. Unlike in the prior art, the proposed design comprises two fins, wherein one Fin (or group of parallel Fins) comprises anode and n-tap, and other Fin (or group of parallel Fins) comprises cathode and p-tap, constituting altogether the proposed Dual-Fin SCR. In an aspect, as key regions of the proposed SCR (anode and cathode), which carry the majority of the current after triggering, are placed diagonally unlike conventional designs, provides substantial benefit in terms of spreading current and dissipating heat. The key idea in SCR ESD protection device is to obtain regenerative feedback between base-collector junctions of two back-to-back bipolar transistors, which enables the SCR to shunt ESD current.

Figure 7:
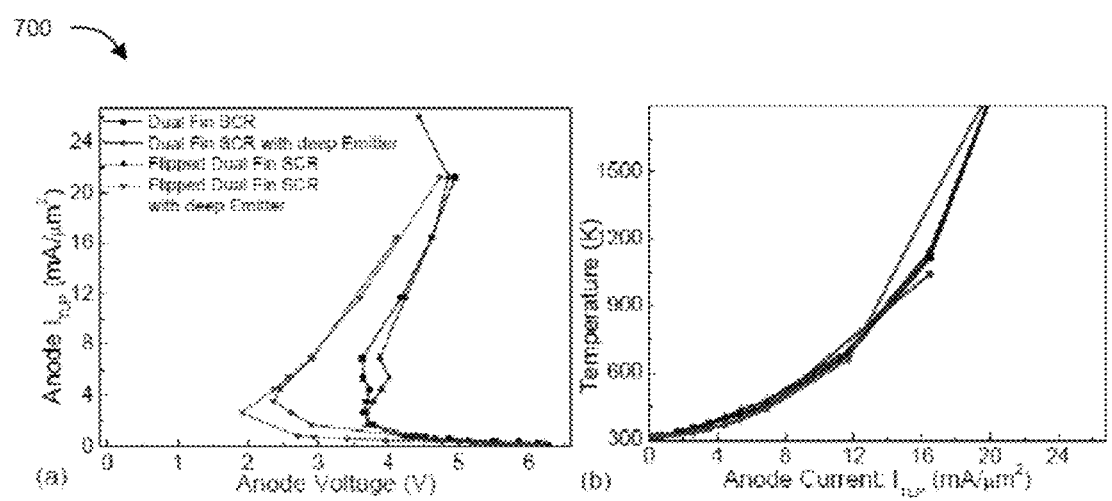
FIG. 7 illustrates TLP IV characteristics and lattice temperature as a function of stress current of the proposed dual fin SCR device in accordance with an embodiment of the present disclosure.

In an exemplary implementation, ESD behavior of the proposed device was simulated using 3D device TCAD in the configuration where the anode and n-tap were stressed, and cathode and p-tap terminals were grounded. TLP results presented in FIG. 7 show very low turn-on voltage and holding voltage. In addition to this, the proposed device offers a 2 times better ESD current handling capability per unit area when compared to planar counterpart. Holding voltage of the proposed device can be further modified by tuning $L_{AC}$, well doping profiles, emitter junction depth and lengths, which provide flexibility to tune I-V characteristics of the ESD protection element as per chip operating requirements.

In conventional SCRs, well junction undergoes avalanche breakdown, and generated electrons are collected by n-tap whereas excess holes are collected by the p-tap. As the holes migrate towards the p-tap, base potential of the n-p-n transistor is increased, which forward biases the base-emitter junction (here the p-Well-Cathode junction; thereby turning on the n-p-n transistor), further leading to the electron emission from the emitter (Cathode) terminal. These electrons then decrease the n-Well potential, which forward biases the n-well-anode junction, and turns on the p-n-p transistor. This regenerative feedback mechanism allows turn-on of the both the bipolar transistors, and results in low trigger and holding voltage.

In the proposed Dual Fin SCR structure, on the other hand, triggering taps are purposefully placed on both sides of the emitter so that carrier conduction path gets divided and base-emitter junction effectively sees a uniform base potential. Such an arrangement mitigates current crowding, which results in reduced self heating and mobility degradation. These aspects aid in efficient forward biasing of base-emitter junction and therefore bipolar turn-on, which manifests as deep voltage snapback seen in the TLP characteristics.

In an exemplary embodiment, a deep voltage snapback of 2.5 V for Dual Fin SCR and 4.2 V for Flipped Dual Fin SCR (FIG. 9) can be observed from TLP IV characteristics (shown in FIG. 7). Flipped configuration (FIG. 9) of the proposed SCR design exhibits much deeper NDR region due to increased bipolar strength of both n-p-n and the p-n-p transistors unlike in Dual Fin SCR, where only the n-p-n bipolar is efficient.

Figure 8:
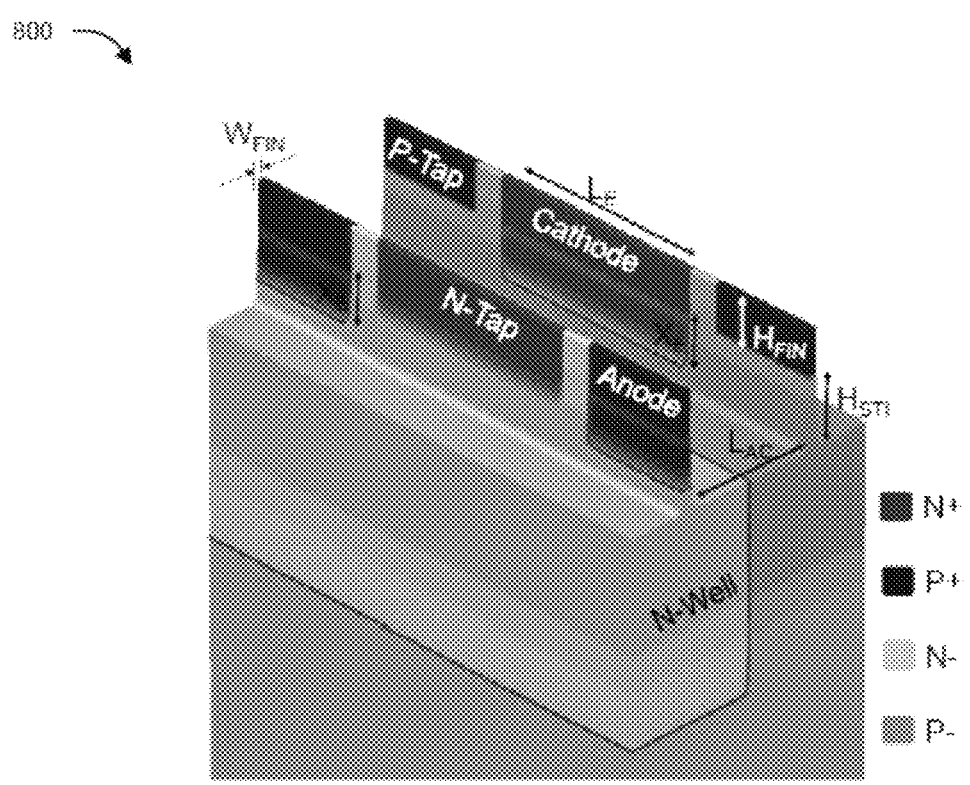
FIG. 8 illustrates deep emitter configuration of the proposed dual fin SCR device in accordance with an embodiment of the present disclosure.

In an aspect, in order to forward bias base-emitter junction more effectively, emitter junction depth can be increased (deep Emitter configuration, see FIG. 8). Hence, holding voltage can be adjusted by varying emitter doping profile. Also, bipolar triggering voltage can be altered by varying well doping profiles and length of the emitter region. These design variations provide flexibility to tune I-V characteristics of ESD protection element as per chip operating requirements.

Figure 9:
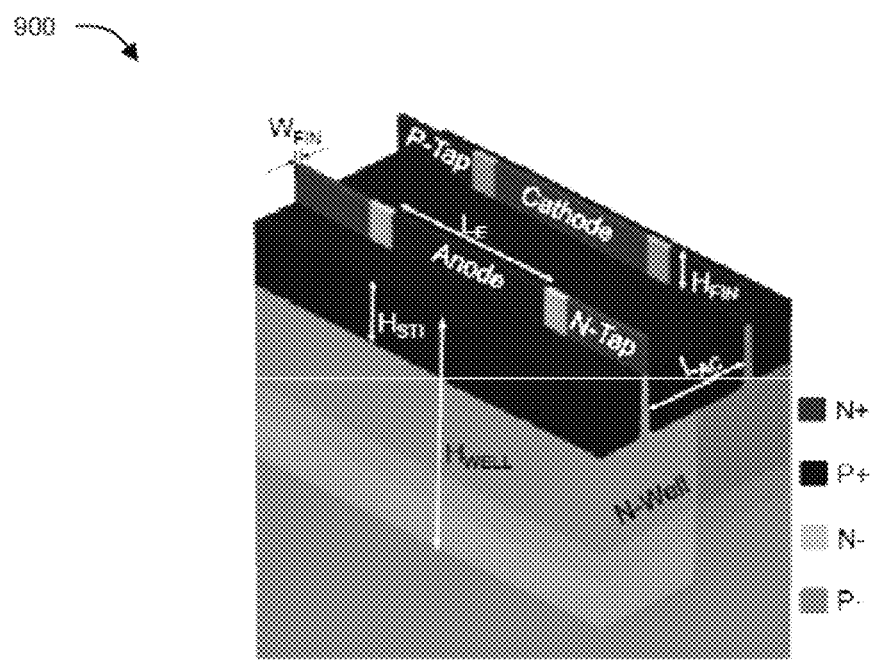
FIG. 9 illustrates flipped configuration of the proposed dual fin SCR device in accordance with an embodiment of the present disclosure.
Figure 10:
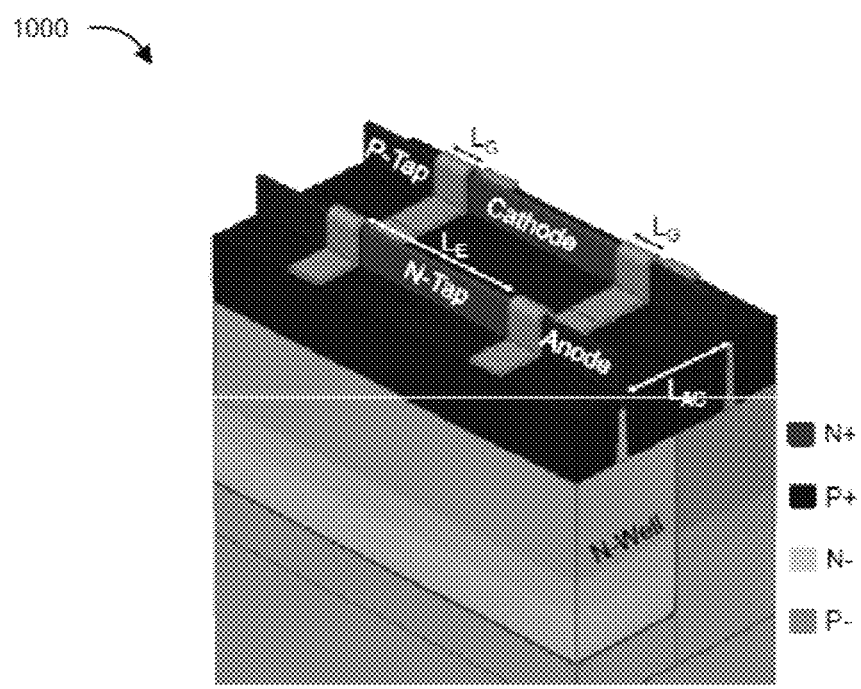
FIG. 10 illustrates another configuration of the proposed Dual Fin SCR device with gate metallization separating n-tap to anode and p-tap to cathode in accordance with an embodiment of the present disclosure.
Figure 11:
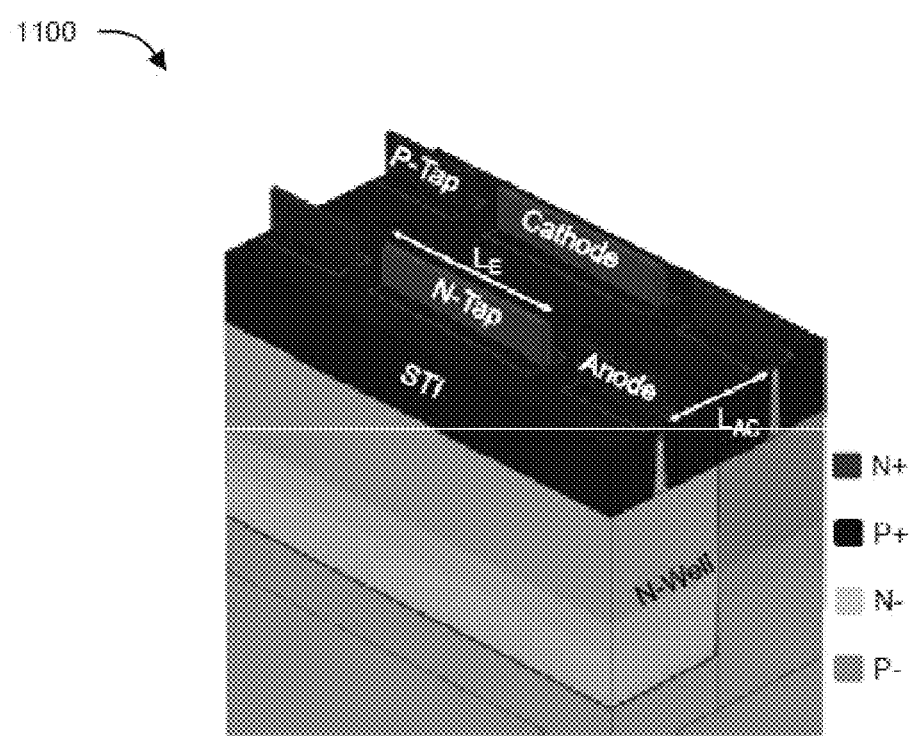
FIG. 11 illustrates another configuration of the proposed Dual Fin SCR device with shallow trench isolation (STI) separation between n-tap to anode and p-tap to cathode in accordance with an embodiment of the present disclosure.
Figure 12:
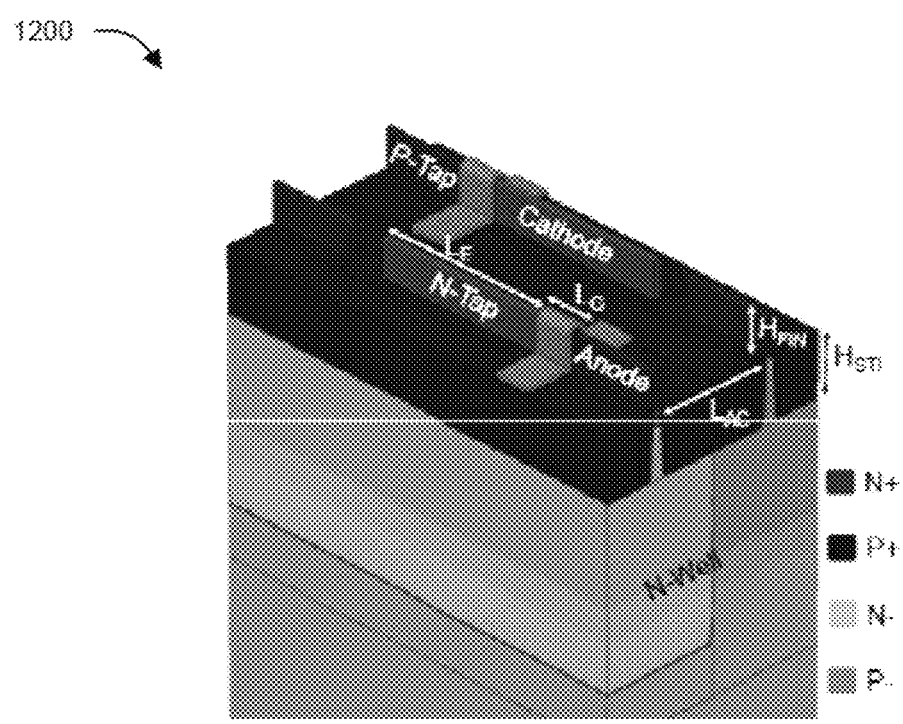
FIG. 12 illustrates another configuration of the proposed Dual Fin SCR device with both gate metallization and shallow trench isolation (STI) separation between the n-tap to anode and the p-tap to cathode in accordance with an embodiment of the present disclosure.
Figure 13:
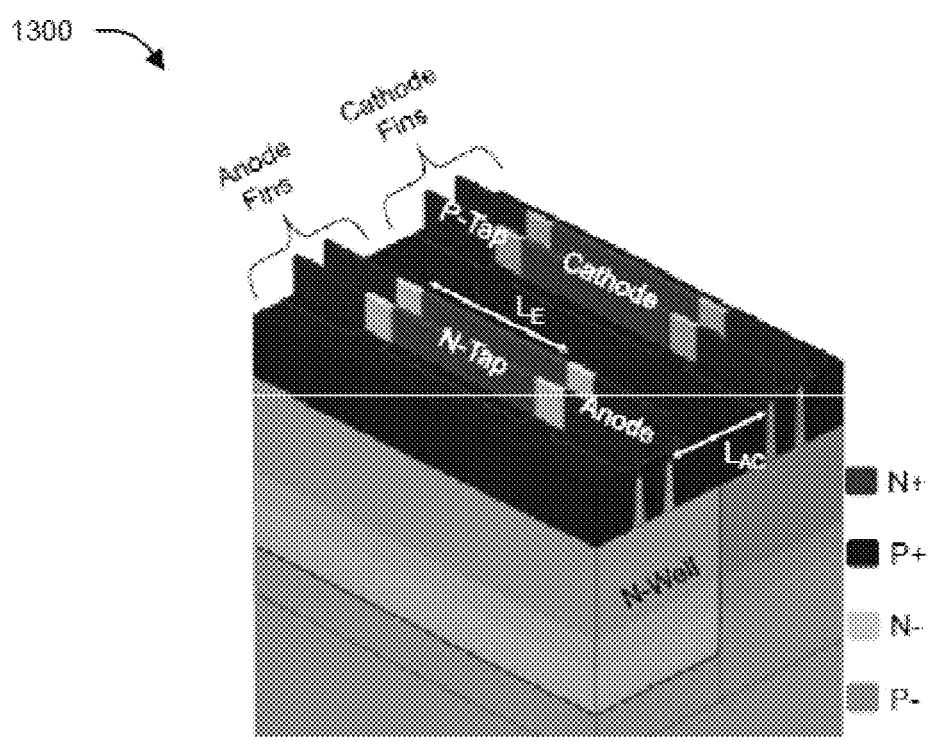
FIG. 13 illustrates another configuration of the proposed Dual Fin SCR device where number of anode and cathode fins can be extended to obtain higher failure thresholds in accordance with an embodiment of the present disclosure.
Figure 14:
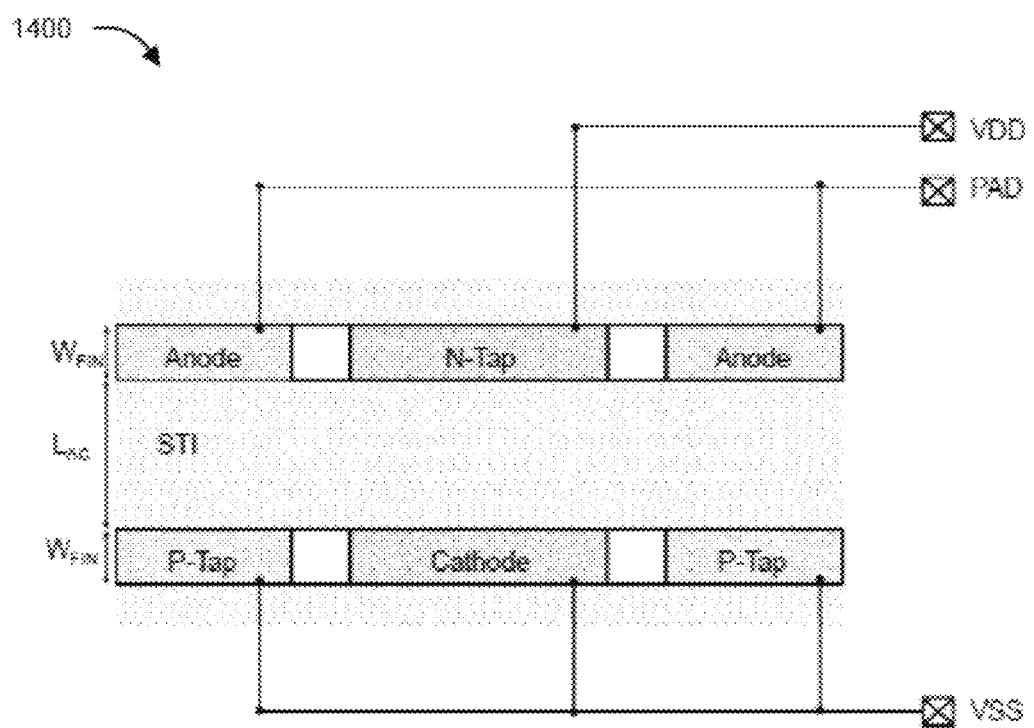
FIG. 14 illustrates another configuration of the proposed Dual Fin SCR device (top view) in transient triggered configuration for an ESD protection between pad and ground in accordance with an embodiment of the present disclosure.
Figure 15:
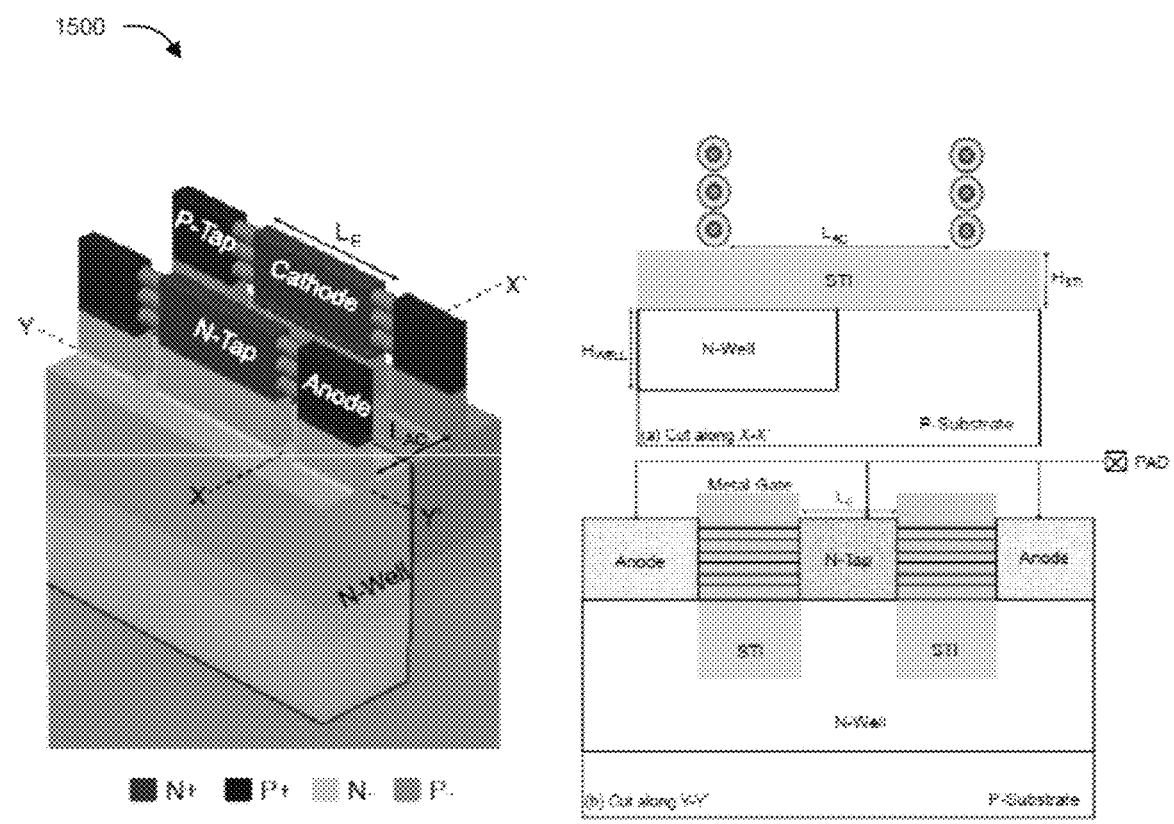
FIG. 15 illustrates another configuration of the proposed Dual Fin SCR device where Fins are replaced by Nanowires in accordance with an embodiment of the present disclosure.

As mentioned above, FIG. 8 illustrates an exemplary embodiment of proposed Dual Fin SCR device with deep anode and cathode junctions. FIG. 9 illustrates an exemplary embodiment of proposed Dual Fin SCR device in Flipped configuration where anode and cathode regions are placed parallel to each other. FIG. 10 illustrates another embodiment of the proposed Dual Fin SCR device with gate metallization separating n-tap to anode and p-tap to cathode. FIG. 11 illustrates another embodiment of the proposed Dual Fin SCR device with shallow trench isolation (STI) separation between n-tap to anode and p-tap to cathode. FIG. 12 illustrates yet another embodiment of the proposed Dual Fin SCR device with both gate metallization and shallow trench isolation (STI) separation between the n-tap to anode and the p-tap to cathode. FIG. 13 illustrates yet another embodiment of the proposed Dual Fin SCR device where number of anode and cathode fins can be extended to obtain higher failure thresholds. FIG. 14 illustrates yet another embodiment of the proposed Dual Fin SCR device (top view) in transient triggered configuration for an ESD protection between pad and ground. FIG. 15 illustrates yet another embodiment of the proposed Dual Fin SCR device where Fins are replaced by Nano-wires.

In an aspect therefore, the present disclosure relates to a dual fin SCR device comprising two parallel fins that are disposed over a substrate, a first fin of which has a base region of first conductivity type (N-Well), and a second fin of which has base region of the second conductivity type (P-Well). The first fin with the base region of first conductivity type includes alternate anode and n-tap regions where, the anode region is of second conductivity type and n-type trigger tap is of first conductivity type. Similarly, second fin having the base region of the second conductivity type consists of alternate p-tap and cathode regions where, the p-tap region is of second conductivity type, and the cathode region of first conductivity type. The proposed device further comprises a shallow trench isolation (STI) region isolating the two parallel fins (first and second).

In another embodiment, proposed device further relates to a Dual Fin SCR device comprising two parallel fins disposed over a substrate, first fin of which has a base region of first conductivity type (N-Well), and second fin of which has base region of the second conductivity type (P-Well). First fin with the base region of the first conductivity type comprises of alternate anode and n-tap regions where the anode region is of second conductivity type and n-type trigger tap is of first conductivity type. Similarly, second fin having the base region of the second conductivity type consists of alternate p-tap and cathode regions where the p-tap region is of second conductivity type, and the cathode region of first conductivity type. The proposed device further comprises a shallow trench isolation (STI) region isolating the two parallel fins, and a gate stack disposed between the anode and n-tap, and between the cathode and the p-tap, as an isolation.

In yet another embodiment, proposed device further relates to a Dual Fin SCR device comprising two parallel fins disposed over a substrate, a first of which has a base region of first conductivity type (N-Well), and second fin of which has the base region of second conductivity type (P-Well). The first fin with the base region of the first conductivity type consists of alternate anode and n-tap regions where the anode region is of second conductivity type and n-type trigger tap is of first conductivity type. Similarly, the second fin having the base region of the second conductivity type consists of alternate p-tap and cathode regions where the p-tap region is of second conductivity type and the cathode region of first conductivity type. The proposed device further comprises a shallow trench isolation (STI) region isolating the two parallel fins, and an additional STI isolation between the anode and n-tap, and between the cathode and the p-tap.

In yet another embodiment, the present disclosure relates to a Dual Fin SCR device comprising two parallel fins disposed over a substrate, a first fin of which has a base region of first conductivity type (N-Well) and second fin of which has base region of second conductivity type (P-Well). First fin with the base region of the first conductivity type can include alternate anode and n-tap regions where the anode region is of second conductivity type and n-type trigger tap is of first conductivity type. Similarly, the second fin having the base region of the second conductivity type can include alternate p-tap and cathode regions where the p-tap region is of second conductivity type and the cathode region of first conductivity type. The proposed device can further include a shallow trench isolation (STI) region isolating the two parallel fins, and an alternate gate and STI isolation between the anode and n-Tap, and between the cathode and the p-tap.

In an aspect, above-mentioned semiconductor devices can include one or more fins that are parallel to each other in a given well region. In an exemplary aspect, the number of fins can be multiplied in X and Y direction in order to increase current handling capability. In yet another exemplary aspect, another semiconductor device can also be configured that is complementary to the above-mentioned device configurations.

In another aspect, proposed semiconductor device can be configured such that anode and/or cathode has deeper junctions compared to n- and p-taps. In another aspect, fins can be replaced by an array of nanowires on top of each other, with or without spacing between them.

The present disclosure further relates to an ESD protection mechanism/technique for protection between PAD and ground based on exemplary 3D semiconductor device configurations mentioned above, wherein n-tap is connected to VDD, Anode is connected to PAD, p-tap and Cathode are connected with ground, and SCR is triggered transiently by clamp between VDD and Ground.

The present disclosure further relates to an ESD protection mechanism/technique for protection based on above-disclosed exemplary 3D semiconductor devices, wherein gate between tap and Anode/Cathode is connected to a trigger circuit or a power bus. One or more of the above-mentioned exemplary 3D devices can further include guard-rings. One or more of the above-mentioned exemplary 3D devices can further be configured such that substrate can be a semiconductor or an insulator or a stack of two. Furthermore, exemplary 3D devices mentioned above can be configured such that Nanowire or Fin could be made of any or a combination of Si, SiGe, Ge, materials belonging to III-V or III-Nitride groups, transition metal dichalcogenides or other 2-Dimentional semiconductors. As would be appreciated, scope of the present disclosure further covers, as part of its scope and protection, an integrated circuit that includes one or more of the above-disclosed device configurations.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

ADVANTAGES OF THE INVENTION

The present disclosure provides an ESD protection device.

The present disclosure provides a dual fin SCR ESD protection device.

The present disclosure provides a semiconductor/SCR device for non-planar technologies with tunable trigger and holding voltage for efficient and robust ESD protection.

The present disclosure provides a semiconductor/SCR device that has better ESD robustness per unit area.

We claim:

1. A Dual Fin Silicon Controlled Rectifier (SCR) comprising:
   a first fin configured on a substrate and comprising alternate anode and n-tap regions, wherein the first fin has a base region of a first conductivity type (N-type), the anode is of a second conductivity type (P-type), the n-tap region is of the first conductivity type, and the anode is placed on both sides of the n-tap region; and
   a second fin configured on the substrate and parallel to the first fin, wherein the second fin comprises alternate cathode and p-tap regions, the second fin has a base region of the second conductivity type, the cathode is of the first conductivity type, and the p-tap region is of the second conductivity type.

2. The SCR of claim 1, wherein
the anode and the cathode are placed diagonal to each other.

3. The SCR of claim 1, wherein
the SCR obtains regenerative feedback between base collector junctions of two back-to-back bipolar transistors to shunt ESD current.

4. The SCR of claim 1, wherein
holding voltage of the SCR is modified by any or a combination of tuning $L_{AC}$, tuning well doping profile, and tuning emitter junction depth and lengths.

5. The SCR of claim 1, wherein
the SCR is configured with gate metallization that isolates the n-tap from the anode, and isolates the p-tap from the cathode.

6. The SCR of claim 1, wherein
the SCR is configured with shallow trench isolation (STI) separation between the first fin and the second fin.

7. The SCR of claim 1, wherein
the SCR is configured with shallow trench isolation (STI) separation between the n-tap and the anode of the first fin, and between the p-tap and the cathode of the second fin.

8. The SCR of claim 1, wherein
the SCR is configured with a combination of gate metallization and shallow trench isolation (STI) separation between n-tap and anode and cathode and p-tap.

9. The SCR of claim 1, wherein
the SCR can include a first set of fins as part of the first fin, and a second set of fins as part of the second fin, wherein the number of fins that form part of the first set and the second set are selected based on any or a combination of optimal failure thresholds, and optimal current handling capability.

10. The SCR of claim 1, wherein
the SCR is configured in transient triggered configuration for ESD protection between pad and ground.

11. The SCR of claim 1, wherein
any or both of the first fin and the second fin are replaced by Nano-wires.

12. The SCR of claim 11, wherein
the nanowire or the fins are made of any or a combination of Si, SiGe, Ge, materials belonging to III V or III Nitride groups, transition metal dichalcogenides, or a 2-Dimensional semiconductor.

13. The SCR of claim 1, wherein
any or both of the anode or the cathode have deeper junctions compared to the n-tap region and the p-tap region.

14. The SCR of claim 1, wherein
the n-tap region is connected to VDD, the anode is connected to PAD, and the p-tap region and the cathode are connected with ground, and wherein the SCR is triggered transiently by clamp between the VDD and the Ground.

15. The SCR of claim 1, wherein
gate between the n-tap or the p-tap and the anode or the cathode is connected to a trigger circuit or a power bus.

16. The SCR of claim 1, wherein
the substrate is any of a semiconductor or an insulator or a stack of the two.

17. A semiconductor device comprising:
a first fin configured on a substrate and comprising alternate anode and n-tap regions, wherein the first fin has a base region of a first conductivity type (N-Well), the anode is of a second conductivity type, the n-tap region is of the first conductivity type, and the anode is placed on both sides of the n-tap region; and
a second fin configured on the substrate and parallel to the first fin, wherein the second fin comprises alternate cathode and p-tap regions, the second fin has a base region of the second conductivity type, the cathode is of the first conductivity type, and the p-tap region is of the second conductivity type.

18. An integrated circuit comprising semiconductor device of claim 17.

* * * * *